United States Patent [19]

Hite

[11] 3,956,643

[45] May 11, 1976

[54] MOS ANALOG MULTIPLIER

[75] Inventor: Larry R. Hite, Plano, Tex.

[73] Assignee: Texas Instruments Incorporated, Dallas, Tex.

[22] Filed: Sept. 12, 1974

[21] Appl. No.: 505,437

[52] U.S. Cl. ................................ 307/229; 307/221; 307/179; 307/303; 307/304; 330/35

[51] Int. Cl.² ........................................... H03B 17/00

[58] Field of Search ............ 330/30 D, 35; 307/254, 307/229, 179, 303, 304, 221 D; 328/160 D

[56] References Cited

UNITED STATES PATENTS

| | | | |
|---|---|---|---|
| 3,614,411 | 10/1971 | Henderson | 328/160 |
| 3,753,009 | 8/1973 | Clapper | 307/279 |
| 3,870,966 | 3/1975 | Dingwall | 330/35 X |

*Primary Examiner*—Stanley D. Miller, Jr.
*Assistant Examiner*—B. P. Davis
*Attorney, Agent, or Firm*—Harold Levine; James T. Comfort; William E. Hiller

[57] ABSTRACT

A four quadrant multiplier in which a semiconductor chip has a pair of MOSFET differential amplifiers formed with MOSFET current sources for both amplifiers. Currents through the differential amplifiers are modulated 180° out of phase in response to first multiplier input voltages. Currents through one FET of each said amplifier and a second FET of each said amplifier are modulated in response to second multiplier input voltages 180° out of phase.

Active MOSFETs form a load connected to the drains of the first FET of both amplifiers while other active MOSFETs form a load connected to the drain of the second FET of both amplifiers to produce a product voltage across at least one of the load FETs.

20 Claims, 7 Drawing Figures

MOS ANALOG MULTIPLIER

This invention relates to an MOSFET analog multiplier, and more particularly to a monolithic circuit implemented totally in FET structures.

Heretofore linear four quadrant multipliers have been provided using bipolar transistors as the basic circuit elements. While there are several techniques for performing analog multiplication, the technique known as variable transconductance has been found to be most readily implemented in semiconductor systems. Such circuits are based upon the fact that the output of the transistor amplifier depends upon both the input signal and the magnitude of an effective emitter resistance where a common emitter configuration is employed. Based upon such understanding, bipolar multipliers have heretofore been disclosed. Exemplary of such devices is a device manufactured and sold by Motorola Semiconductor, Inc. of Phoenix, Ariz. and identified as the MC1595 circuit.

The present invention is directed to a MOSFET four quadrant multiplier. It is capable of duplicating the results of bipolar systems above referred to but carries out the functions in a structure which is much simpler than the bipolar device and operates at lower power. It permits all of the components of such a multiplier to be active components and to be incorporated as a monolithic structure in a single semiconductor chip.

More particularly, in accordance with the present invention, there is provided a four quadrant multiplier in which a semiconductor chip has a pair of MOSFET differential amplifiers formed with MOSFET current sources for both amplifiers. Means on the chip modulates the currents through the differential amplifiers 180° out of phase in response to first multiplier input voltages. Current through one FET of each said amplifier and a second FET of each said amplifier are modulated in response to second multiplier input voltages 180° out of phase. An active MOSFET forms a load connected to the drain terminals of the first FET of both amplifiers. An active MOSFET forms a load connected to the drain terminals of the second FET of both amplifiers, and a circuit is provided for extracting an output product voltage developed across at least one of the load FETs.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

Figure 1:
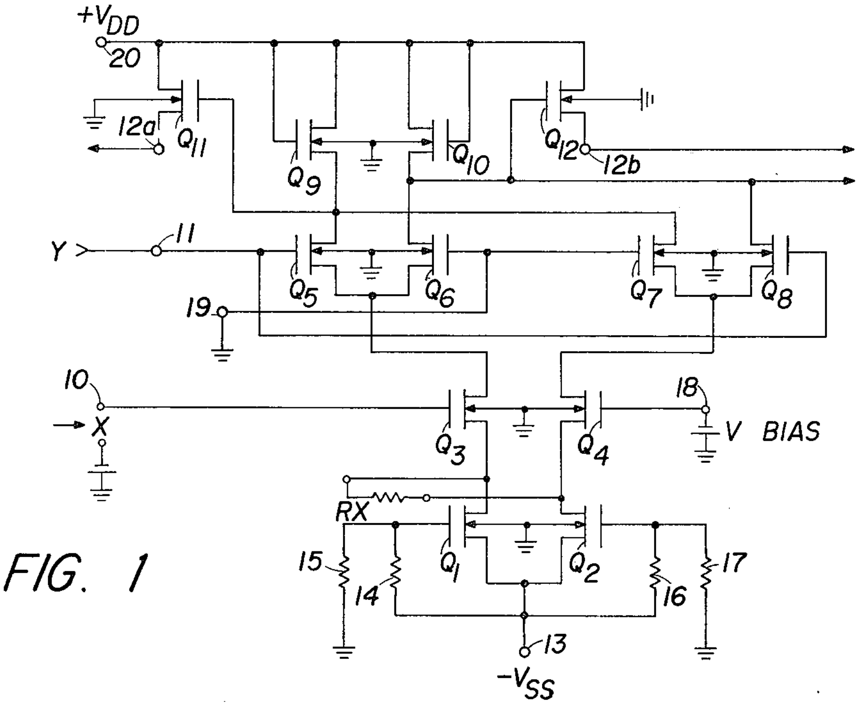
FIG. 1 illustrates, in discrete circuit form, a multiplier embodying the present invention operating in the N channel depletion mode where a D.C. offset of the input is employed.

Referring now to FIG. 1, an N channel depletion mode multiplier has been illustrated wherein two input signals X and Y, the product of which is to be produced, may be applied to the input terminals 10 and 11, respectively. The product voltage would then appear between output terminal 12*a* and ground or output terminal 12*b* and ground. Alternatively, the voltage between terminals 12*a* and 12*b* would provide a differential output.

The circuit includes a first pair of transistors Q1 and Q2 which serve as current sources. The sources of transistors Q1 and Q2 are connected to the $V_{SS}$ terminal 13. The gate of transistor Q1 is connected to $V_{SS}$ by way of resistor 14 and to ground by way of resistor 15. Similarly, the gate of transistor Q2 is connected to $V_{SS}$ by way of resistor 16 and to ground by way of resistor 17. The drains of transistors Q1 and Q2 are connected to the sources of transistors Q3 and Q4, respectively. The sources of transistors Q3 and Q4 are connected together externally by resistor $R_x$. Resistor $R_x$ provides degeneration of the gain of transistors Q3 and Q4 providing a scale factor adjustment for the x input. In some cases, $R_x$ may be zero, depending upon the gain desired in the Q3, Q4 stage. The gate of transistor Q3 forms the input terminal 10 for input voltages X. The gate of transistor Q4 is shown connected to $V_{bias}$. Alternatively, the inputs to transistors Q3 and Q4 can be a differential input with the +X signal being connected to terminal 10 and the −X signal being connected to terminal 18.

For the purpose of the present description, it will be assumed that terminal 18 is connected to signal ground so that at the drain of transistor Q3 there appears the inversion signal −X and at the drain of transistor Q4 there appears the signal +X. The drain of transistor Q3 is connected to the common sources of transistors Q5 and Q6 while the drain of transistor Q4 is connected to the common sources of transistors Q7 and Q8.

The Y input terminal 11 is connected to the gates of transistors Q5 and Q8. The gates of transistors Q6 and Q7 have a common terminal 19 which is connected to ground. As above noted, a differential input can be applied between terminals 11 and 19 as is desired. The present description will assume that terminal 19 is grounded.

The drains of transistors Q5 and Q7 are connected together and to the source of a load transistor Q9 as well as to the gate of a source follower output transistor Q11. The drains of transistors Q6 and Q8 are connected together and to the source terminal of a load transistor Q10 as well as to the gate of a source follower output transistor Q12. The drains of transistors Q9, Q10, Q11 and Q12 are connected to the $+V_{DD}$ supply terminal 20. The gates of transistors Q9 and Q10 are also connected to the $+V_{DD}$ terminal 20.

In operation, the transconductance of differential transistors Q5-Q8 are controlled by the input Y. Transistors Q5 and Q6 form a differential pair whose source current is controlled by the current source Q3. Transistors Q7 and Q8, a second differential pair and a current source Q4 develop an output product across the load devices Q9 and Q10 opposite in phase to that produced by the transistors Q5 and Q6. When input X is 0, the signals cancel. When input X is positive, the source current in transistors Q5 and Q6 decreases. The source current in transistors Q7 and Q8 increases and the output is produced across load transistors Q9 and Q10 in proportion to the differential gate signal. Likewise, a negative input of input X reverses the polarities through the drain currents of transistors Q5 and Q6. Transistors Q5–Q8 form a square function of the gate voltage. The use of active load transistors Q9 and Q10 causes the output voltage to be linearly related to the gate voltage.

Figure 2:
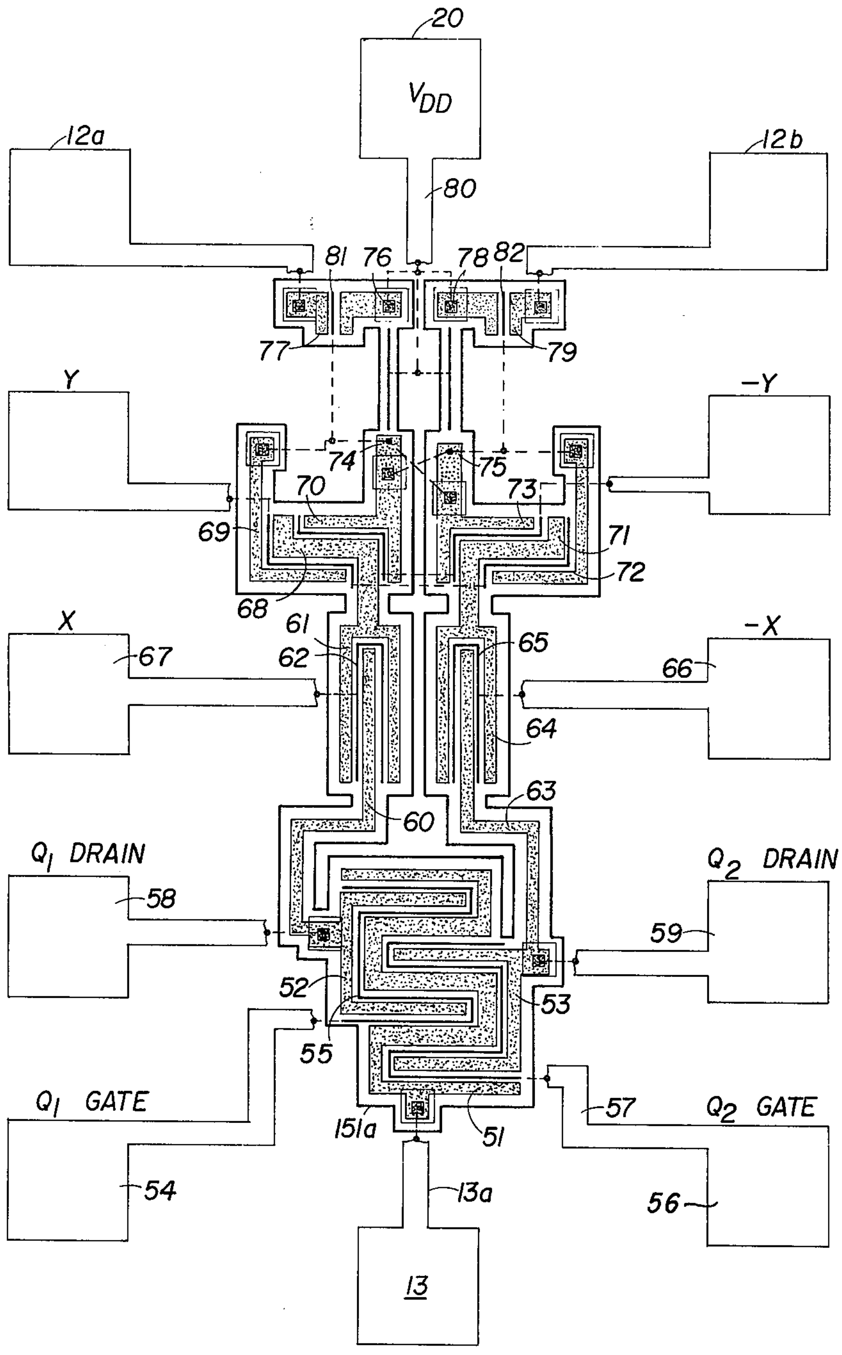
FIG. 2 is a bar composite of a system embodying the transistors of FIG. 1.

In FIG. 2, the circuit of FIG. 1 is illustrated embodied in a monolithic structure on a single semiconductor chip where consistent like parts have been given the same reference characters as in FIG. 1. In this system, the resistors 14–17 of FIG. 1 have not been included and in the actual embodiment of the system, such resistors were connected externally.

Terminal 13 is shown as an edge pad on a chip 50. A metallized lead 13a makes contact with the source 51. Source 51 serves as the source for both transistors Q1 and Q2. The source 51 of transistors Q1 and Q2 is interdigitated with the drain 52 of transistor Q1 and the drain 53 of transistor Q2. A gate 55 is connected to pad 54 and is positioned over the space on chip 50 between the source 51 and the drain 52. In a similar manner, a gate 57 is connected to pad 56 and serves to span the space between drain 53 and source 51. Pad 58 is connected to the drain 52 of transistor Q1. The pad 59 is connected to the drain 53 of transistor Q2. Drain 52 is electrically common with the source 60 of transistor Q3 and thus utilizes a common diffusion region in chip 50. The drain 61 of transistor Q3 is of inverted U-shape and encompasses source 60. The space between source 60 and drain 61 is spanned by a gate 62. In a similar manner, the drain 53 is common to the source 63 of transistor Q4. The drain 64 is of inverted U-shape encompassing the source 63. The space therebetween is spanned by a gate 65 which is connected to pad 66. Gate 62 is connected to pad 67. The drain 61 of transistor Q3 is electrically common to the sources of transistors Q5 and Q6. Thus, diffusion 68 serves as the sources for the two transistors Q5 and Q6. The drain 69 for transistor Q5 is L-shaped. The drain 70 serves transistor Q6. In a similar manner, the drain 64 is electrically common with the source 71 for transistors Q7 and Q8. The drain 72 serves transistor Q8. The drain 73 serves transistor Q7.

Drain 70 is electrically common to the source 74 of transistor Q9. Drain 73 is electrically common to source 75 of transistor Q10. Drain 76 of transistor Q9 is spaced from the source 74. The path between source 74 and drain 76 is a long narrow path so that transistor Q9 serves as a load impedance for transistor Q5. Drain 76 is common to the drain of transistor Q11 whose source 77 is connected to output pad 12*a*. The drain 78 for transistor Q10 similarly is spaced from source 75 by a long narrow current path. Drain 78 is common to the drain of transistor Q12 whose source 79 is connected to the output pad 12*b*.

Consider now the configuration of the metallization strips connected to the $V_{DD}$ pad 20. The metallization including pad 20 and strip 80 extends to cover the gate area between sources 74 and 75 and drains 76 and 78. Strip 80 also contacts the drains of transistors Q9 and Q10 and the drains of transistors Q11 and Q12. Strip 81 forms the gate for transistor Q11 and thus overlies the gap between the source 76 and the drain 77. Strip 81 also contacts the drain 69 of transistor Q5, source 74 of transistor Q9 and drain 73 of transistor Q7. The strip 82 serves as the gate for transistor Q12 and contacts the drains of transistors Q6 and Q8 and the source 75 of transistor Q10.

With a device constructed as above described, the entire multiplier may be formed on a single semiconductor chip. The external bias for transistors Q1 and Q2 may then be provided by external resistors 14–17. The input may be single ended by applying voltage X to terminal 10, voltage Y to terminal 11. The inputs may be differential inputs with the X multiplier input signal being applied to terminals 10 and 18 and the Y multiplier input signal being applied to terminals 11 and 19.

The output may be obtained from terminal 12*a* or 12*b* or differential output obtained from the voltage between terminals 12*a* and 12*b*.

Figure 3:
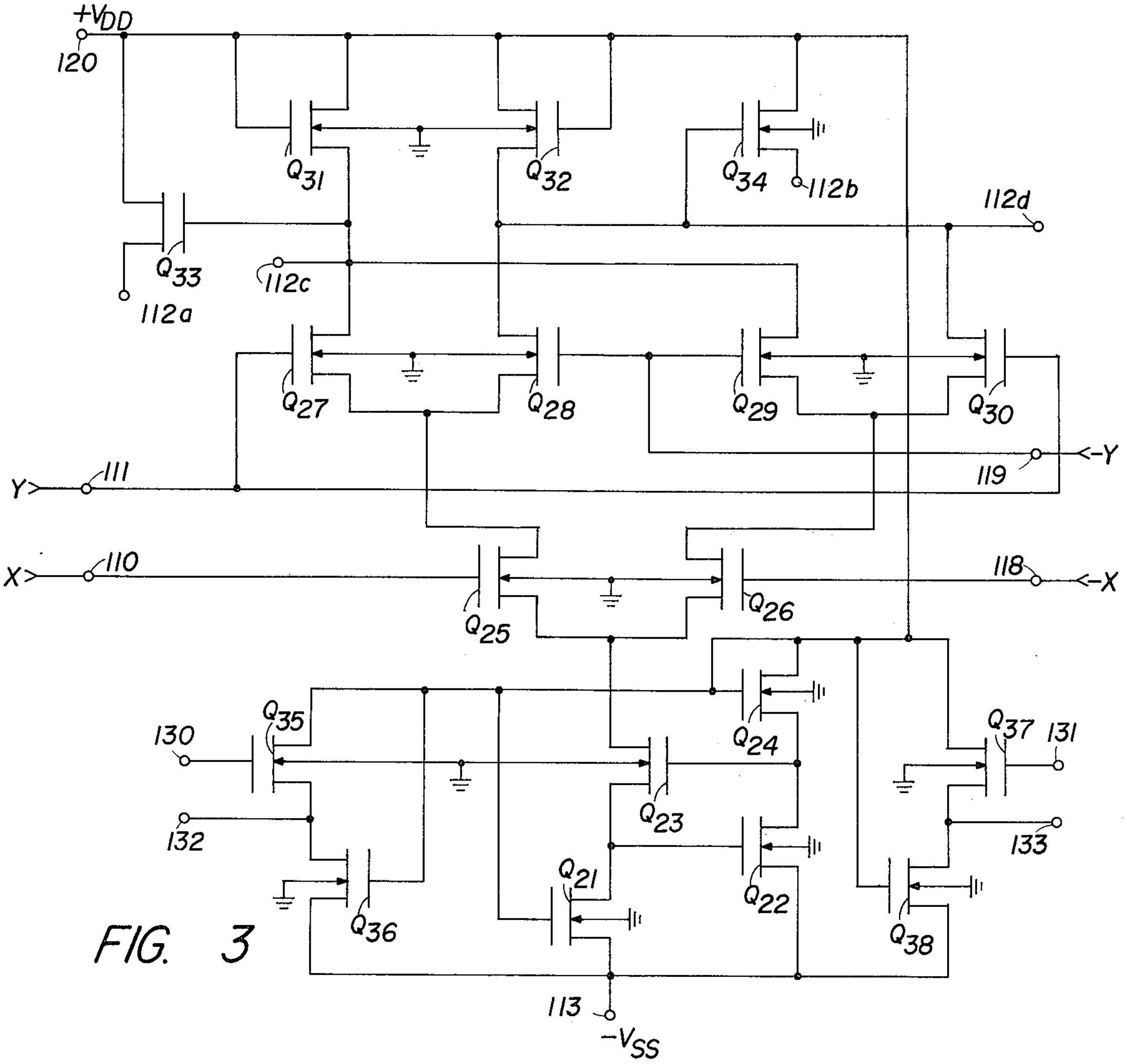
FIG. 3 is a discrete element diagram of a preferred embodiment of the invention in which load functions are performed by active devices and in which provision is made for eliminating the necessity for D.C. offset biasing.

Referring now to FIG. 3, a preferred embodiment of the invention has been illustrated. Input terminals 110 and 118 are provided for the X multiplier input signal. Input terminals 111 and 119 are provided for Y multiplier input signals. Terminal 113 is to be connected to $-V_{SS}$ and terminal 120 to $+V_{DD}$.

Transistors Q25–Q34 have Q3–Q12 as counterparts in the circuit of FIGS. 1 and 2. The current source for transistors Q25 and Q26 is formed by transistors Q21–Q24. This source circuit avoids the necessity of utilizing biasing resistors such as resistors 14–17 of FIG. 1. More particularly, the source of transistor Q21 is connected to terminal 113. The drain is connected to the source of transistor Q23 and to the gate of transistor Q22. The drain of transistor Q23 is connected to the common source terminals of transistors Q25 and Q26. The source of transistor Q22 is connected to $V_{SS}$ terminal 113. The drain of transistor Q22 is connected to the gate of transistor Q23 and to the source of transistor Q24. The drain of transistor Q24 is connected to the gate of transistor Q21 and is connected to $V_{DD}$ terminal 120. In this circuit configuration, the transistor Q23 serves as the current source for transistors Q25 and Q26. Transistor Q21 serves as a source load impedance. Transistors Q22 and Q24 serve to control the bias on transistor Q23.

The discrete circuits of transistors Q25–Q34 are otherwise identical to the circuit of FIG. 1. In this system, as in FIG. 1, output terminals 112*a* and 112*b* have been provided. In addition, output signals may be taken directly from terminal 112*c* or terminal 112*d*.

In addition to the foregoing, provision is made in the circuit of FIG. 3 to avoid the necessity of providing a D.C. offset for the input voltage X. In this system, the X input signal may be applied to terminal 130 with terminal 131 connected to ground. Terminal 130 is connected to the gate of transistor Q35 the source of which is connected through a transistor Q36 to $V_{SS}$ terminal 113. The drain of transistor Q35 is connected to the gate of transistor Q36, i.e., $V_{DD}$ terminal 120. Transistors Q35 and Q36 thus connected form a source follower the output terminal of which, the terminal 132, may then be connected to terminal 110. In the similar manner, transistors Q37 and Q38 form a source follower, the output terminal of which, the terminal 133, may be connected to terminal 118.

Significant in the system illustrated in FIG. 3 is the fact that there are no resistive elements required. All of the components of the circuit may thus be integrated in MOSFET construction on a single semiconductor substrate.

In the system of FIG. 1, the transistors were constructed having width to length (W/L) ratios as follows:

TABLE I

| | |
|---|---|
| Q1, Q2 | 100 |
| Q3, Q4 | 50 |
| Q5, Q6, Q7, Q8 | 25 |
| Q9, Q10 | 0.1 |
| Q11, Q12 | 10 |

In the circuit of FIG. 3, the width to length ratios were as set out in Table II:

TABLE II

| | |
|---|---|
| Q21 | 1.38 |
| Q22 | 100 |
| Q23 | 100 |
| Q24 | 0.03 |
| Q25, Q26 | 5.5 |
| Q27, Q28, Q29, Q30 | 5.5 |
| Q31, Q32 | 0.06 |
| Q33, Q34 | 7.5 |
| Q35, Q37 | 1.83 |
| Q36, Q38 | 0.3 |

A system executed in MOSFET in accordance with FIG. 3 is a preferred embodiment in that it provides improved linearity and extended dynamic range of operation beyond that of FIG. 2. It also provides means to operate the device without external current source biasing and input signal biasing for the X input.

Figure 4:
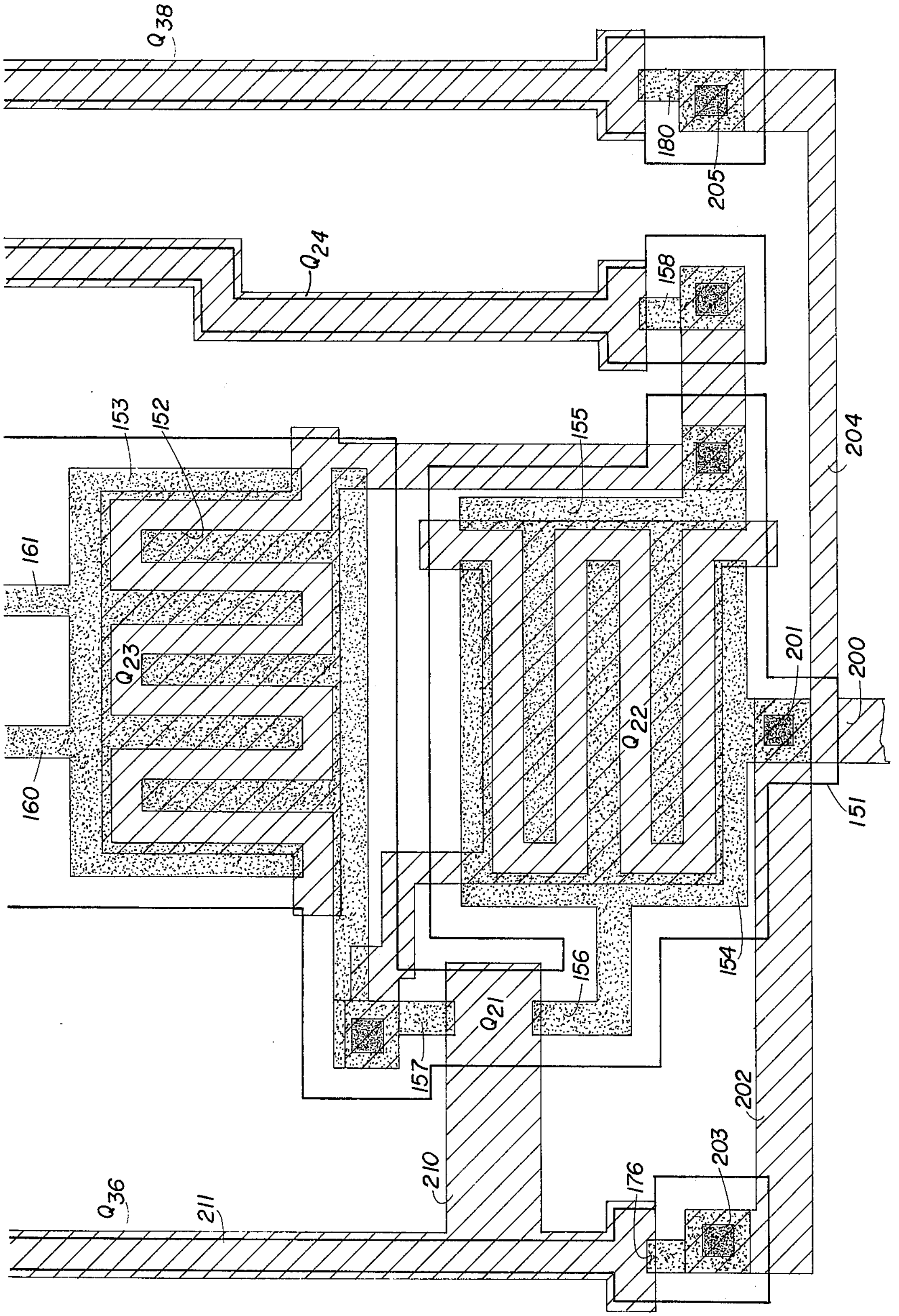
FIGS. 4 and 5 illustrate an integration of the discrete elements of FIG. 3 in a single semiconductor chip.
Figure 5:
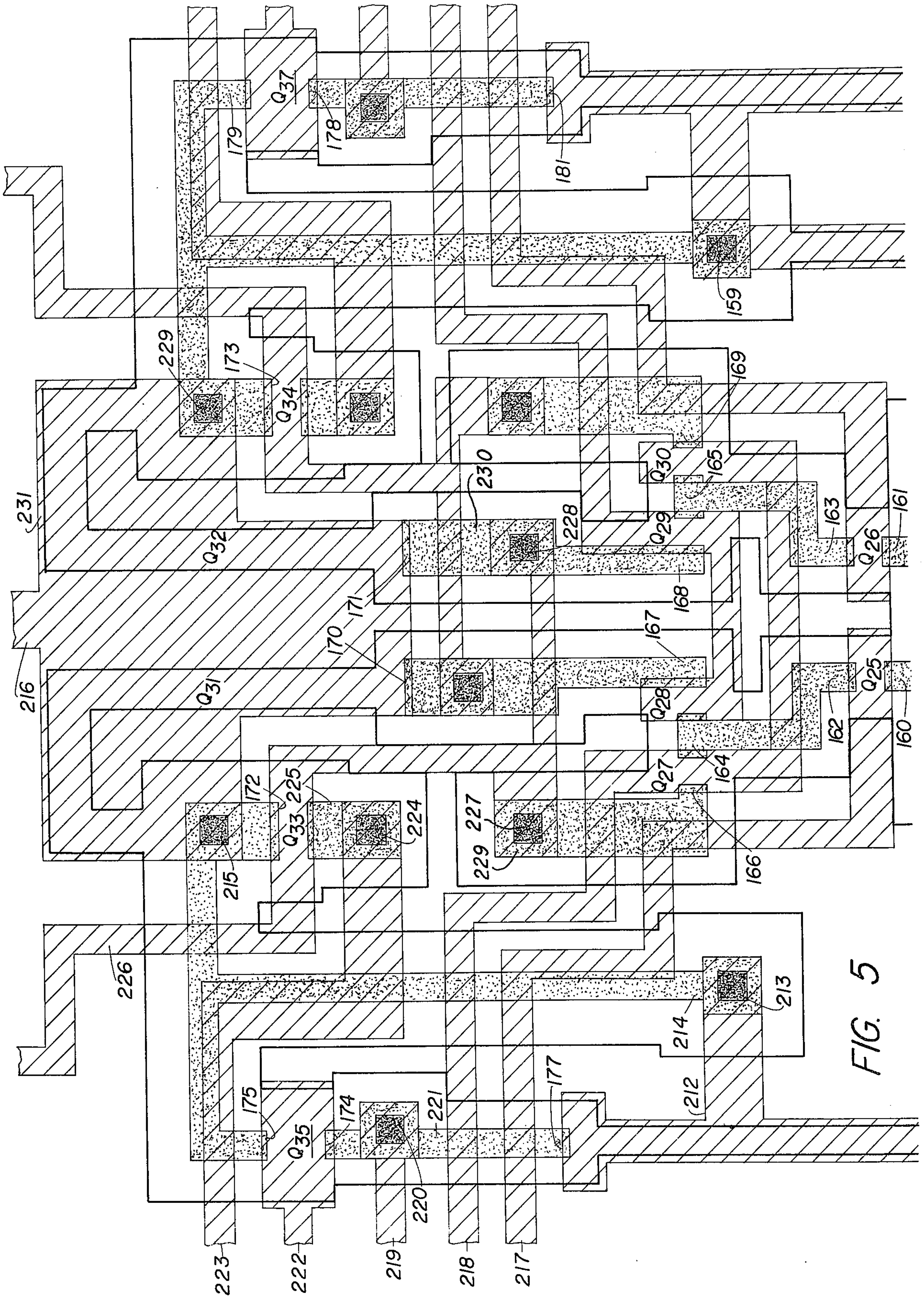

In construction of the circuit of FIG. 3 in a monolithic MOSFET form on a single semiconductor chip, the arrangement illustrated in FIGS. 4 and 5 was employed. A 14 pad chip 150 is employed with the output pads bearing the same reference characters as in FIG. 3.

Apparent from an inspection of FIGS. 4 and 5 is the existence of channel stop 151. A like channel stop 151*a* is provided in the system of FIG. 2. The line 151 represents the channel stop which is a continuous boundary extending throughout the chip to define areas in which active elements are to be formed. Assuming the substrate to be a P-type semiconductor, the channel stop is formed by diffusing boron to form a P+ layer about 0.0002 inch deep in the substrate in the area outside the desired channel stop boundary 151. Thereafter, the sources and drains are formed by diffusing N-type material into the P substrate to depths of about 0.0002 inch at selected areas within the channel stop 151.

Transistor Q23 which forms the current source for transistors Q25 and Q26 has its source 152 interdigitated with its drain 153. Transistor Q22 has source electrode 154 interdigitated with drain electrode 155. Transistor Q21 has source 156 in common with source 154 and drain 157 in common with source 152. Transistor Q24 has source 158 and drain 159. Thus, transistor Q24 has a long narrow gate region. Transistors Q22 and Q23 have short wide gate regions. Transistor Q21 has a relatively short narrow gate region. The ratios preferably are as set out in Table II.

Transistors Q25 and Q26 have sources 160 and 161, respectively, which are common to the drain 153 of transistor Q23. The drains 162 and 163 of transistors Q25 and Q26 are connected to the sources 164 and 165, respectively, by a common diffusion. Source 164 serves as the source of transistors Q27 and Q28. Source 165 serves as the source for transistors Q29 and Q30. Transistor Q27 has drain 166. Transistor Q28 has drain 167. Transistor Q29 has drain 168 and transistor Q30 has drain 169. Transistor Q31 has source 170. Transistor Q32 has source 171. Drains 172 and 173 form portions of transistors Q31, Q33 and Q32, Q34, respectively. The long narrow gate section between source 170 and drain 172 provides the resistor function for the transistors Q28 and Q30. A similar path provides the resistor function for transistors Q27 and Q29. Transistor Q35 has a source electrode 174 and a drain electrode 175. Transistor Q36 has source 176 and drain 177.

Transistor Q37 has a source 178 and a drain 179. Transistor Q38 has a source 180 and a drain 181.

Consider now the interconnections of the various elements of FIGS. 4 and 5. Pad 113 forming the $V_{SS}$ terminal is a metal layer formed on a thick insulation layer which was previously applied to the surface of chip 150. After the diffusions were made, a thin insulation layer was applied within the channel stop region. Strip 200 makes contact through a hole 201 in the thin insulating layer with source 154. A lateral extension 202 makes contact through a hole 203 to the diffusion forming the source of transistor Q36. A lateral extension 204 makes contact through a hole 205 to the diffusion forming the source of transistor Q38.

The gate for transistor Q21 comprises a strip 210. Strip 210 is electrically common to the gate of transistor Q36. This gate strip 211 is elongated to overlie the long narrow channel between source 176 and drain 177. In addition, a lateral extension 212 contacts through a hole 213 in the thin insulation a conductive section 214 formed by diffusion into the substrate of chip 150. Diffused section 214 then forms the drain 175 and contacts through hole 215 the metallized area 216 which is connected to pad 120.

A strip 217 leads from pad 110 beyond source 177 and then courses laterally to form the gate for transistor Q25.

A strip 218 extends from pad 111 to form the gate for transistor Q27 and the gate for transistor Q30.

A strip 219 extends from pad 132 and contacts, through hole 220, a diffusion 221 which forms drain 177 and source 174.

A strip 222 extends from pad 130 to form the gate for transistor Q35. A strip 223 extending from pad 112*a* is connected through a hole 224 to contact a diffusion 225 forming the source of transistor Q33. A strip 226 forms the gate of transistor Q33 and contacts through holes 227 and 228 diffusions 229 and 230. Diffusion 229 forms the drain 166 of transistor Q27. Diffusion 230 forms the drain 168 of transistor Q29 and the source 171 of transistor Q32. A metal area 231 connected to strip 216 forms the gates for transistors Q31 and Q32. Metal area 231 contacts, through holes 215 and 229, the diffusions forming drains 172 and 173 of transistors Q33 and Q34, respectively.

Since the circuit is generally symmetrical, the strips extending from pads 112*d*, 112*b*, 131, 133, 119 and 118 will not be further detailed. Their relation is apparent from the circuit shown in FIG. 3.

Figure 6:
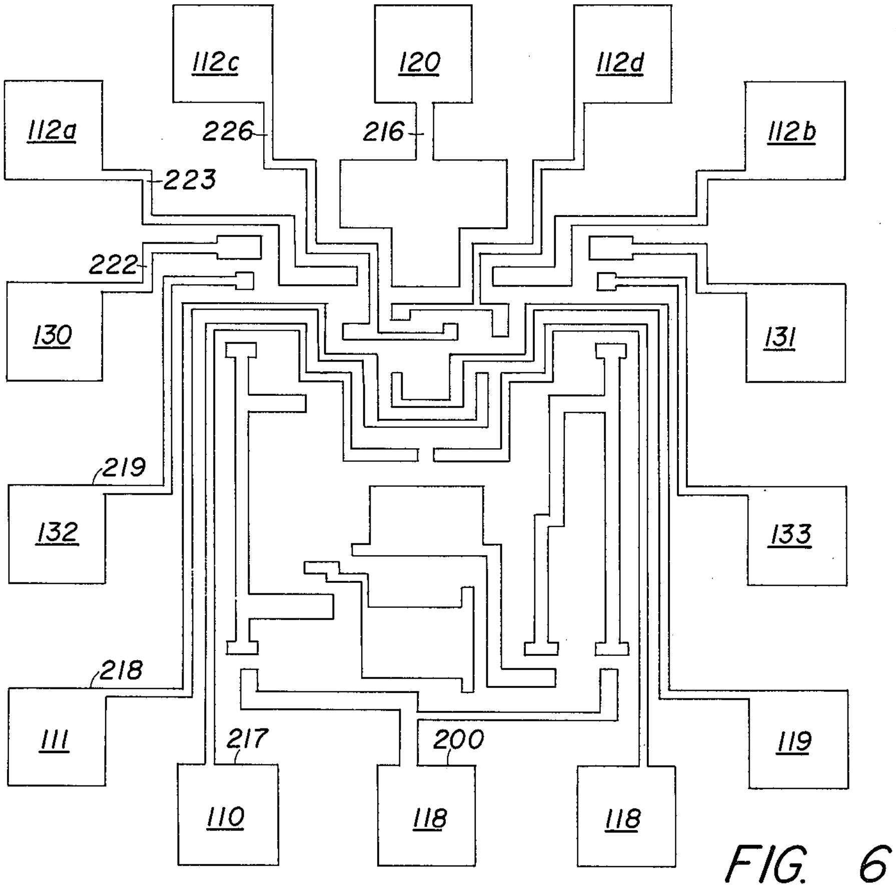
FIG. 6 illustrates surface metallization array in the unit of FIGS. 4 and 5.
Figure 7:
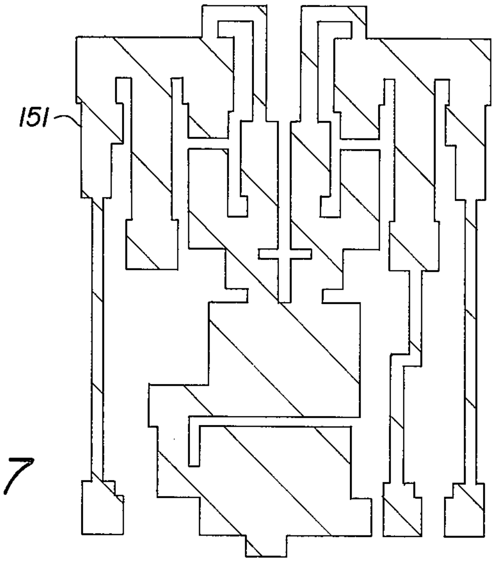
FIG. 7 illustrates diffusion channels of FIGS. 4 and 5 over which the array of FIG. 6 is installed.

In order to further portray the topology of the unit shown in FIGS. 4 and 5, FIG. 6 illustrates the metallization array above described. The geometry of the various surface metallization sections is clearly outlined in FIG. 5 as an aid to understanding the details shown in FIGS. 4 and 5. FIG. 7 illustrates the channel stop 151 which is the boundary of a diffusion into the chip on which the unit is constructed. The metallization pattern of FIG. 6 is to overlay the channels outlined by the channel stop 151 so that the various elements of the multiplier can be formed within the semiconductor body. As above noted, in a P-type semiconductor, the channel stop is formed by a boron diffusion. A P+ layer occupies the region of the substrate outside the desired channel stop bounary. FIGS. 6 and 7 may thus be directly related to one another and to FIGS. 4 and 5.

Having described the invention in connection with certain specific embodiments thereof, it is to be understood that further modifications may now suggest themselves to those skilled in the art and it is intended to cover such modifications as fall within the scope of the appended claims.

What is claimed is:

1. A four quadrant analog multiplier for producing an output product voltage from two input voltages which comprises:

a. a semiconductor chip having three MOSFET differential amplifiers, each having a first and a second current path where one of said amplifiers is connected from its first current path to serve as a current source for a first of the other two amplifiers and is connected at its second current path to serve as the current source for the second of said other two amplifiers, b. a current source terminal leading to said one of said amplifiers, c. means to apply one of said input voltages equally and oppositely to modulate the current in the two paths of said one amplifier, d. means to apply the other of said input voltages to modulate the current in the first path of each of said other two amplifiers equal and opposite to the modulation of the current in the second path of each of said other two amplifiers, and e. means to generate the output product voltage by combining currents from paths oppositely modulated in said other two amplifiers.

2. The combination set forth in claim 1 in which said output product voltage is generated by combined currents from said other two amplifiers connected to flow through an active device.

3. The combination set forth in claim 1 in which said output product voltage is generated by combined currents from said other two amplifiers connected to flow through two active devices, and connections to said active devices are provided for extracting a differential output voltage.

4. A four quadrant analog multiplier which comprises:

a. a semiconductor chip having a pair of MOSFET differential amplifiers formed in said chip with MOSFET current sources for both said amplifiers, b. means in said chip to modulate the currents through said differential amplifiers 180° out of phase in response to a first multiplier input voltage, c. means to modulate the current through one FET of each said amplifier in response to a second multiplfier input voltage and a second FET of each said amplifier in response to said second input voltage 180° out of phase, d. active MOSFETs forming a load connected to the drain terminals of the first FET of both said amplifiers, e. active MOSFETs forming a load connected to the drain terminals of the second FET of both said amplifiers, and f. a circuit for extracting an output product voltage developed across at least one of said load MOSFETs.

5. A four quadrant analog multiplier which comprises:

a. a semiconductor chip having three MOSFET differential amplifiers thereon where one of said amplifiers is connected to serve as a differential current source for the other two amplifiers, b. an active multi MOSFET element connected to serve as a current source for said one of said amplifiers, c. means to differentially modulate the current adjacent arms of said one of said amplifiers in response to one multiplier voltage input signal, d. means to modulate extreme arms of said other two amplifiers differentially with respect to adjacent arms in response to a second multiplier voltage input signal, and e. means to extract an output signal from current combined from an extreme and adjacent arm of said other two amplifiers.

6. A four quadrant analog multiplier for producing an output product voltage from two input voltages which comprises:

a. a semiconductor chip on which there are formed three MOSFET differential amplifiers, each having two current paths where one of said amplifiers is connected from one current path to serve as a current source for one of the other two amplifiers and is connected at its other current path to serve as the current source for the other of said other two amplifiers, b. a current source for said one of said amplifiers, c. input terminal means leading to said one amplifier for receiving a first of said input voltages equally and oppositely to modulate the current in the two paths of said one amplifier, d. input terminals means leading to said other two amplifiers for receiving the second of said input voltages for modulation of the current in one path of each of said other two amplifiers equal and opposite to the modulation of the current in the other path of each of said other two amplifiers, and e. load means on said chip for combining currents from paths in said other two amplifiers having currents which are oppositely modulated.

7. The combination set forth in claim 6 in which said load means is an active device.

8. The combination set forth in claim 6 in which said load means is a long gate FET.

9. The combination set forth in claim 6 in which said load means comprises a pair of long gate FETs each connected at the source node thereof to the drain nodes of two FETs in said other two amplifiers to combine currents oppositely modulated.

10. The combination set forth in claim 6 in which said current source for said one of said amplifiers comprises an active multi element MOSFET circuit.

11. The combination set forth in claim 10 wherein said active multi element MOSFET circuit includes an FET serving as a source transistor connected at its drain terminal to source terminals of FETs comprising said one of said amplifiers, an FET having its drain terminal connected to the source terminal of said source transistor and forming a source load impedance for said source transistor, and a pair of FETs serving as a voltage dropping network to control the bias on said source transistor.

12. The combination set forth in claim 10 in which FET DC offset circuits are provided for receiving said first of said input voltages.

13. A semiconductor chip having a common region therein in which current flow may be controlled, the combination comprising:

a. a plurality of field effect transistors on said chip connected to form three differential amplifiers, a first of which is connected to supply current to the second and third, and wherein two drains of said first amplifier are formed as two diffusions in said chip with each diffusion being common to sources of said second and third amplifiers respectively, b. a first input circuit structure for applying a first input signal to gates of said first amplifier equally and oppositely to modulate current flow to four sources of said second and third amplifiers, c. a second input circuit structure for applying a second input signal to first gates of each of said second and third amplifiers and for controlling the second gates of said second and third amplifiers for modulation of current by said first gates equal and opposite the modulation of current by said second gates, d. two load transistors on said chip connected to combine current modulated by the first gate of said second amplifier and by the second gate of said third amplifier and to combine current modulated by the second gate of said second amplifier and by the first gate of said third amplifier, and e. an output circuit leading from one of said load transistors to produce an output voltage due to current flow through the load transistor proportional to the product of said input signals.

14. The combination set forth in claim 13 in which said output circuit leads from both of said load transistors.

15. The combination set forth in claim 13 in which said output circuit comprises a source-follower transistor circuit in said chip connected to said one load transistor.

16. The combination set forth in claim 13 in which a two stage transistor amplifier is provided in each channel of said first differential amplifier and in which said first input signal modulates current flow to said second and third amplifiers at the gates of the second stage of said two stage amplifier.

17. The combination set forth in claim 16, wherein a resistor is provided in said two stage transistor amplifier, said resistor being connected across both channels between the first and second stages and controlling the gain of the second amplifier stage in each channel of said first differential amplifier.

18. The combination set forth in claim 13, further including a multi transistor circuit on said chip connected to the two sources of said first amplifier for supplying current to said first amplifier.

19. The combination set forth in claim 13, further including a $V_{SS}$ terminal on said chip connected to the sources of said first amplifier by way of a first series load transistor and a supply transistor, a gate bias circuit for said supply transistor including two series load transistors, a $V_{DD}$ terminal on said chip, said two series load transistors of said gate bias circuit being source connected to said $V_{SS}$ terminal and drain connected to said $V_{DD}$ terminal with the juncture between said two series load transistors connected to the gate of said supply transistor, the source of said supply transistor being connected to the gate of the first of said two series load transistors, and said $V_{DD}$ terminal being connected to the gate of said first series load transistor and to the gate of the second of said two series load transistors.

20. The combination set forth in claim 13 in which said first input circuit structure includes transistor means to preset the D.C. level compatible with the level of said second input circuit structure.

* * * * *